US011978766B2

United States Patent
Voiron et al.

(10) Patent No.: US 11,978,766 B2
(45) Date of Patent: May 7, 2024

(54) THREE-DIMENSIONAL CAPACITIVE STRUCTURES AND THEIR MANUFACTURING METHODS

(71) Applicants: Murata Manufacturing Co., Ltd., Nagaokakyo (JP); COMMISSARIAT A L'ENERGIE ATOMIQUE ET AUX ENERGIES ALTERNATIVES, Paris (FR)

(72) Inventors: Frédéric Voiron, Barraux (FR); Julien El Sabahy, Grenoble (FR); Hiroshi Nakagawa, Caen (FR); Naoki Iwaji, Nagaokakyo (JP); Guy Parat, Grenoble (FR)

(73) Assignees: MURATA MANUFACTURING CO., LTD., Nagaokakyo (JP); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 418 days.

(21) Appl. No.: 17/496,185

(22) Filed: Oct. 7, 2021

(65) Prior Publication Data
US 2022/0093726 A1     Mar. 24, 2022

Related U.S. Application Data

(63) Continuation of application No. PCT/EP2020/059820, filed on Apr. 6, 2020.

(30) Foreign Application Priority Data

Apr. 8, 2019   (EP) ..................................... 19305457

(51) Int. Cl.
*H01G 4/12*      (2006.01)
*H01G 4/012*     (2006.01)
(Continued)

(52) U.S. Cl.
CPC ............. *H01L 28/92* (2013.01); *H01G 4/012* (2013.01); *H01G 4/306* (2013.01); *H01G 4/33* (2013.01); *H01L 28/88* (2013.01)

(58) Field of Classification Search
CPC ......... H01L 28/92; H01L 28/88; H01L 28/90; H01G 4/012; H01G 4/306; H01G 4/33; H01G 4/008; H01G 4/10; H01G 4/1272
See application file for complete search history.

(56) References Cited

U.S. PATENT DOCUMENTS

2016/0268144 A1 *  9/2016  Voiron ................... H01L 28/90
2019/0088419 A1    3/2019  Ryou et al.

FOREIGN PATENT DOCUMENTS

WO         2015063420 A      5/2015

OTHER PUBLICATIONS

International Search Report issued for PCT/EP2020/059820, dated Jul. 21, 2020.

(Continued)

*Primary Examiner* — Herve-Louis Y Assouman
(74) *Attorney, Agent, or Firm* — Arentfox Shiff LLP

(57) ABSTRACT

Three-dimensional capacitive structures may be produced by forming a capacitive stack conformally over pores in a region of porous anodic oxide. The porous anodic oxide region is provided on a stack of electrically-conductive layers including an anodization-resistant layer and an interconnection layer. In the pores there is a position having restricted diameter quite close to the pore bottom. In a first percentage of the pores in the region of anodic oxide, a functional portion of the capacitive stack is formed so as to extend into the pores no further than the restricted-diameter position. Cracks that may be present in the anodization-resistant layer have reduced effect on the properties of the capacitive structure. Increased thickness of the anodization- (Continued)

resistant layer can be tolerated, enabling equivalent series resistance of the overall capacitive structure to be reduced.

15 Claims, 5 Drawing Sheets

(51) Int. Cl.
*H01G 4/30* (2006.01)
*H01G 4/33* (2006.01)
*H01L 23/00* (2006.01)
*H01L 29/00* (2006.01)
*H01L 49/02* (2006.01)

(56) References Cited

OTHER PUBLICATIONS

Extended European Search Report issued for EP 19 30 5457, dated Oct. 17, 2019.
Lee, W. et al.; "Highly ordered porous alumina with tailor-made pore structures fabricated by pulse anodization"; Nanotechnology 21 (2010), vol. 21, No. 48, pp. 485304 1-8.
Losic, D. et al.; "Porous Alumina with Shaped Pore Geometries and Complex Pore Architectures Fabricated by Cyclic Anodization"; Small, vol. 5, No. 12, Jun. 19, 2009, pp. 1392-1397.

* cited by examiner

THREE-DIMENSIONAL CAPACITIVE STRUCTURES AND THEIR MANUFACTURING METHODS

CROSS REFERENCE TO RELATED APPLICATIONS

The present application is a continuation of International application No. PCT/EP2020/059820, filed Apr. 6, 2020, which claims priority to European Patent Application No. 19305457.4, filed Apr. 8, 2019, the entire contents of each of which are incorporated herein by reference.

FIELD OF THE INVENTION

The present invention relates to the field of electrical/electronic devices and to methods of their fabrication. More particularly, the invention relates to devices that incorporate three-dimensional capacitive structures, and to methods of manufacturing such devices.

BACKGROUND OF THE INVENTION

In recent years, as part of the trend to increase the degree of integration of electronic components, a need has arisen for integrated capacitors having increased capacitance density. One of the solutions that has been adopted to achieve a higher capacitance density is to amplify the surface area of electrodes that are used to provide capacitance. For example, a silicon capacitor which has been proposed by Murata Integrated Passive Solutions was fabricated in a process that employed semiconductor technologies to form three-dimensional structures (relief, texture), such as holes, trenches or columns, in silicon and then layers of metal/dielectric were formed conformally over the 3D structure to provide large-area electrodes.

Another approach that has been proposed for providing a high-density capacitor consists in creating a porous region of anodic metal oxide (e.g. anodic aluminum oxide, AAO) and then depositing a single or repeated Metal-Insulator-Metal (MIM) stack structure conformally over the porous region, such that the MIM layers follow the contours of the pores and have a resultant large surface area. According to this approach, typically, a metal layer (for example, an aluminum layer) is formed on a silicon substrate and then an anodization process is performed on a selected region of the metal layer to create there a high density of uniform, self-assembled trenches, or "pores". This porous region of anodic oxide acts as a template upon which conductive layers and dielectric layers are then deposited. Strictly speaking the pores are defined in an anodic metal oxide layer that forms during the anodization process. FIG. 1A illustrates a template of the above-described kind formed by anodization.

US 2019/0088419 describes a high-density capacitor created by forming conductive and insulative layers in a porous anodic oxide matrix.

SUMMARY OF THE INVENTION

Use of porous anodic oxide is an effective technique to enhance the surface area of the electrodes, but there can be a problem in achieving a sufficiently-low Equivalent Series Resistance (ESR) of the fabricated capacitive structure. To overcome this difficulty, a proposal has been made (WO2015/063420) to remove the anodic oxide layer at the bottoms of the pores so that the interior of each pore can be brought into communication with a stack of electrically conductive layers provided at the substrate side. In this way, the lower layer of the MIM stack in each pore is connected, on the substrate side, to the lower layer of the MIM stack in an adjacent pore, lowering the ESR of the overall structure.

FIG. 1B is a simplified diagram illustrating a capacitive structure 50 of the general kind described in WO2015/063420. A region 52a of porous AAO is formed in an aluminum layer 52 provided on a silicon substrate 51. More specifically, the aluminum layer 52 is formed on a stack of layers comprising: a lower electrically-conductive layer 58, and an upper layer 59 which is resistant to anodization/anodic etching. The pores in the anodic oxide region 52a are open at the substrate side. Accordingly, a first metal layer 53 that is formed conformally over the porous region 52a comes into contact with the underlying stack of layers 58, 59. The anodization-resistant layer 59 has sufficient electrical conductivity to enable a good electrical connection to be made, at the bottoms of the pores, between the electrically-conductive layer 58 and the first metal layer 53. A dielectric layer 54 and second electrically conductive layer 55 form, with the first conductive layer 53, a MIM stack which functions as a capacitive element.

Typically, a first terminal of the capacitive element is formed on the side 56 remote from the substrate by making a connection to the second conductive layer 55. The second terminal of the capacitive element may be formed on either side of the structure (i.e. on the side 56 or on the substrate side) by making a connection to the electrically conductive layer 58.

It has been found that the yield of the manufacturing process which makes capacitive structures of the type illustrated in FIG. 1B depends on the thickness of the layers 58 and 59, as illustrated in Table 1 below.

TABLE 1

| Thickness of electrically-conductive layer 58 | Thickness of anodization-resistant layer 59 | Manufacturing yield |
| --- | --- | --- |
| Thin | Thin | High |
| Thin | Thick | Medium |
| Thick | Thin | Medium |
| Thick | Thick | Low |

It can be seen from Table 1 that the best yield is obtained when both of the layers 58 and 59 are thin (noting that what constitutes "thin" is different for layer 59 compared to layer 58). However, in order to obtain a good reduction in ESR it is preferable for the layers 58 and 59 to be relatively thick.

Experiments have been performed to investigate what phenomena may affect the yield of the manufacturing process and it is believed that the condition of the surface of the anodization-resistant layer may have a significant impact on the performance of the capacitive stack.

From examination of the micro-structure of the architecture, using scanning electron microscopy, it has been found that there can be cracks in the anodization-resistant layer 59. A crack labelled C is indicated schematically in FIG. 1B, and FIG. 1C is an image, obtained by scanning electron microscopy, showing a crack in an anodization-resistant layer made of tungsten (W). These cracks can adversely affect the portions of the MIM stack that are formed at the bottoms of the pores and thereby cause an undesired leakage current to flow. Studies have shown that, in a typical case, cracks can affect the pores over 0.6% of the surface area of the useable porous region.

The present invention has been made in the light of the above-described problems.

The present invention provides a capacitive structure comprising: a substrate providing an electrically-conductive interconnection layer; an anodization-resistant layer formed over the interconnection layer and making electrical contact with the interconnection layer; a region of porous anodic oxide formed on the anodization-resistant layer, the region of porous anodic oxide being traversed by a plurality of elongated pores extending between the anodization-resistant layer and a surface of the anodic oxide remote from the substrate; and a capacitive stack of layers comprising a lower conductive layer, a first insulator layer, and an upper conductive layer, said stack being formed conformally over the pores in said region of porous anodic oxide, and the lower conductive layer being in electrical contact with the anodization-resistant layer, wherein the pores have a position, along their length, where the pore diameter is restricted, and wherein in a first, non-zero percentage of the pores of said region of porous anodic oxide, the upper conductive layer of said stack extends into the pores no further than the position where the pore diameter is restricted.

In capacitive structures according to embodiments of the present invention, in the first percentage of the pores of the anodic oxide region, the functional portion of the capacitive stack which contributes to the capacitance of the finished structure extends into the pores no further than the position where the pore diameter is restricted and so is not in direct contact with the portion of the anodization-resistant layer where cracks may arise. A second portion of the capacitive stack, which makes a negligible contribution to the capacitance of the capacitive structure, is located between the anodization-resistant layer and the position in the pores where the pore diameter is restricted, thus providing electrical contact to the anodization-resistant layer and, hence, to the interconnection layer. Accordingly, the negative effects of cracks in the anodization-resistant layer are reduced. More particularly, undesired leakage current is reduced and the electrical characteristics of the finished structure are improved, thereby the yield of the process used for manufacturing the structures can be improved. In view of the yield improvement, it becomes feasible to make use of relatively thicker layers for the anodization-resistant layer and the electrically-conductive interconnection layer, which facilitates the achievement of a low value of ESR at the same time as a high capacitance density. So, for example, it becomes feasible to use an anodization-resistant layer which is 600 nm thick and an interconnection layer which is 3 μm thick. These are just examples of the dimensions of relatively-thick layers that may be used; other thicknesses may be employed.

Furthermore, as shall be explained below, by locating the functional portion of the capacitive stack above the position where the pore diameter is reduced, there is a reduction in the irregularity of the shape, near the bottoms of the pores, of the functional portion of the MIM stack which contributes to the capacitance of the finished structure. Accordingly, the target properties of the capacitive structure can be obtained more reliably, achieving a capacitive component having improved reliability and increased lifetime.

Moreover, typically the aspect ratio of the pores is high and, at the bottoms of the pores, it is difficult to deposit the layers of the capacitive stack to the desired thickness. This can adversely affect the ESR and breakdown voltage of the overall capacitive structure. However, by locating the functional portion of the capacitive stack above the position where the pore diameter is reduced, non-uniformity in the thickness of the layers of the capacitive stack in the vicinity of the bottoms of the pores has reduced effect (potentially, negligible effect) on the performance of the overall capacitive structure.

In certain embodiments of the invention, in at least 1% of the pores of the porous anodic oxide region the first portion of the capacitive stack of layers, which contributes to the capacitance of the capacitive structure, is located in portions of the pores that are between the restricted-diameter position and the surface of the anodic oxide remote from the substrate.

In certain embodiments of the invention the lower conductive layer of the stack is formed conformally over the pores in the porous region, the first insulator layer is formed on the lower conductive layer, and the upper conductive layer is formed on the first insulator layer. Because the upper conductive layer does not extend beyond the position in the pores where the pore diameter is restricted, the functional portion of the capacitive structure (including both of the first and second conductive layers as well as the interposed insulating layer) is located between the reduced-diameter position in the pores and the surface of the anodic oxide region that is remote from the substrate.

In certain embodiments of the invention, the following relationship is set:

$$D \leq 2(T_{c1} + T_{i1}) \quad (1)$$

where D is the diameter of the pore at the restricted-diameter location, $T_{c1}$ is the thickness of the lower conductive layer, and $T_{i1}$ is the thickness of the first insulator layer.

By ensuring that the above relationship is respected, the upper conductive layer can be prevented from extending into the pores beyond the position of reduced pore diameter.

In certain embodiments of the invention the position where the pore diameter is restricted is located at a distance of 10-300 nm from the bottom of the pores.

In certain embodiments of the invention the anodization-resistant layer is made of tungsten. However, the anodization-resistant layer may be made of other materials including, but not limited to, Ti, Ta, Hf and Nd. In certain embodiments of the invention the average thickness of the anodization-resistant layer is in the range 10 nm-1 μm. In certain embodiments of the invention the anodic oxide is anodic aluminum oxide. However, the porous material may be made of other substances including, but not limited to porous anodized Ti, Si, Ta or Zr.

The present invention still further provides a method of fabricating a capacitive structure, comprising: forming a substrate providing an electrically-conductive interconnection layer; forming over the interconnection layer an anodization-resistant layer making electrical contact with the interconnection layer; forming a metal layer on the anodization-resistant layer; anodizing a region of the metal layer to form a region of porous anodic oxide traversed by a plurality of elongated pores extending between the anodization-resistant layer and a surface of the anodic oxide remote from the substrate; removing oxide formed, at the bottoms of the pores, from the anodization-resistant layer during the anodizing step; and forming conformally over the pores in said region of porous anodic oxide a capacitive stack of layers comprising a lower conductive layer, a first insulator layer, and an upper conductive layer, wherein the lower conductive layer is in electrical contact with the anodization-resistant layer, wherein the pores have a position, along their length, where the pore diameter is restricted, and wherein at least one of the anodizing step, oxide-removing step and capacitive-stack forming step is controlled so that, in a first percentage of the pores of the porous anodic oxide region, the upper conductive layer of said stack extends into the pores no further than said position where the pore diameter is restricted.

The above-recited method provides comparable advantages to those mentioned above in relation to the capacitive structure. Moreover, this method has improved yield compared to prior fabrication methods.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF THE PRESENT INVENTION

The inventors have studied the potential origin of the cracks that can occur in the anodization-resistant layer. Their studies suggest that such cracks may arise because there are weak points in the anodization-resistant layer 59 in the vicinity of the bottoms of the pores. The current understanding of the origin of such weak points is explained below.

Figure 1A:
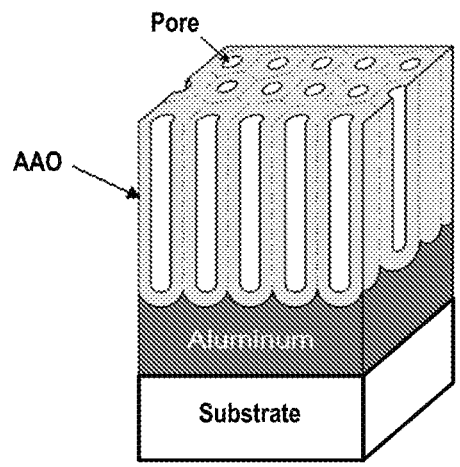
FIG. 1A schematically illustrates a porous anodic aluminum oxide template formed on a substrate.
Figure 1B:
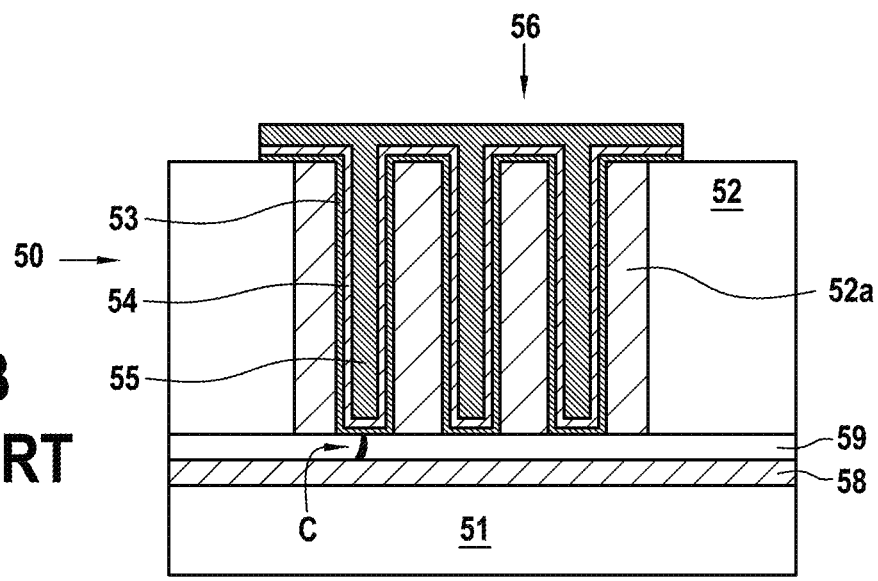
FIG. 1B illustrates a capacitive structure formed in a region of porous anodic oxide and having reduced equivalent series resistance.
Figure 1C:
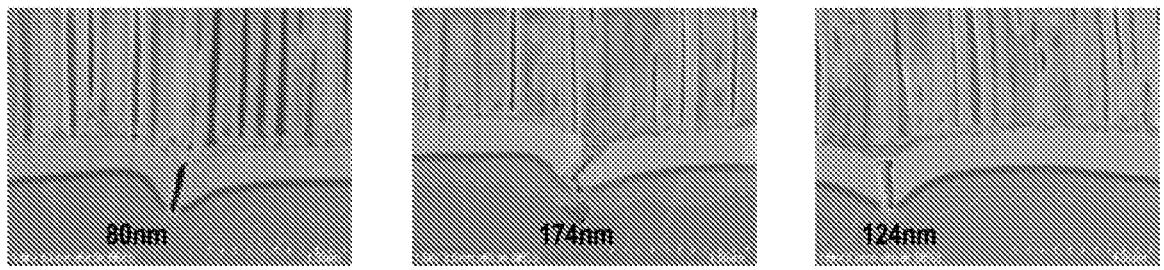
FIG. 1C shows a scanning electron micrograph illustrating a crack in an anodization-resistant layer present in structures such as that of FIG. 1B.

During fabrication of a capacitive structure such as the structure 50 illustrated in FIG. 1B, an anodization process is performed to create the pores of the porous anodic oxide region 52a, and the anodization process is continued until the bottoms of the pores are opened, to a sufficient degree, onto the upper layer 59. During that part of the anodization process which opens the pore bottoms, there is a certain degree of migration of atoms of the material (e.g. tungsten, W) forming the anodization-resistant layer 59 at regions which underlie the pores, and undesired small regions of oxide (e.g. tungsten oxide) are formed. Each of these small regions of undesired oxide is shaped roughly like a biconvex lens. Before deposition of the MIM stack in the pores this undesired oxide is removed, typically by an etching process. It is believed that this migration of atoms in the material forming the anodization-resistant layer 59 results in weak points in the anodization layer 59, and a propensity to cracking.

In view of this technical analysis, techniques have been devised for mitigating the negative effects of such cracks in the anodization-resistant layer. Embodiments of the invention exploit the fact that the pores in the anodic oxide may have a position of reduced diameter, this position being towards the bottoms of the pores.

Figure 2A:
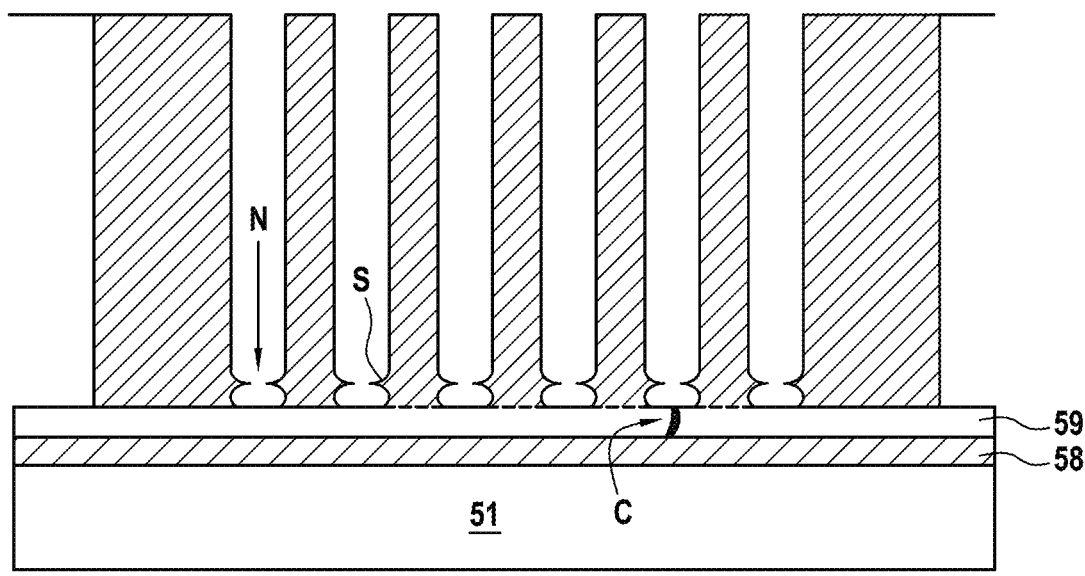
FIG. 2A is a cross-sectional view schematically illustrating reduced-diameter positions in the pores.
Figure 2B:
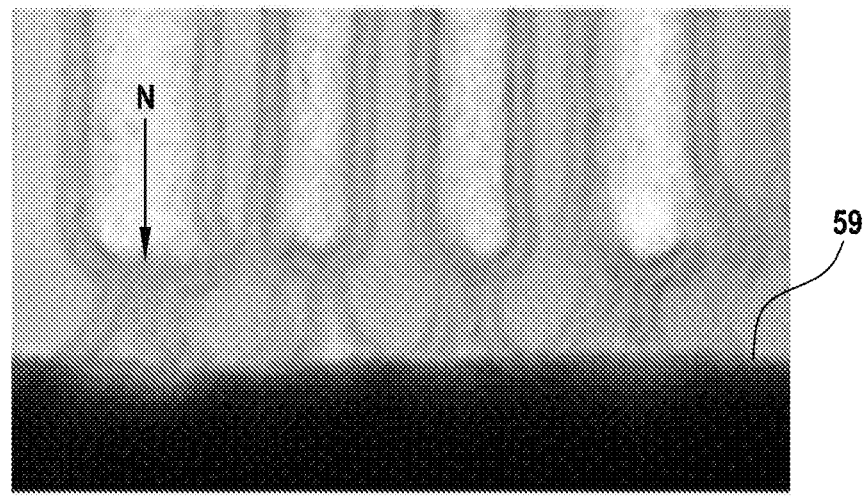
FIG. 2B represents a scanning electron micrograph illustrating, highly magnified, the bottoms of the pores.

It has been realized that, as illustrated schematically in FIG. 2A, the pores formed by the manufacturing method described above with reference to FIG. 1B do not have a uniform cross-sectional area along the entirety of their length. Instead, they have an unusual and characteristic shape as can be seen in FIG. 2B which is an enlarged view of the bottoms of a set of pores, produced by scanning electron micrography.

More particularly, it has been found that there is a reduced-diameter neck portion, N, near the bottom of each pore at a position close to the anodization-resistant layer 59. The position of this reduced-diameter of the pores is not directly above the surface of the anodization-resistant layer 59, typically it arises between 10 nm to 300 nm from that surface (e.g. in the case of using a tungsten layer as the anodization-resistant layer). Also, the periphery of the pore has a fan-like shape in the region under the location having minimum pore diameter. Considered another way, there is a roughly annular spur S extending into the pore at a position not far from the anodization-resistant layer. It is understood that this characteristic shape arises due to the formation and removal of the undesired oxide during that part of the anodization process which opens the bottoms of the pores.

In embodiments of the invention, the capacitive stack is formed in the pores of the anodic oxide region so that, in at least 1% of the pores, a functional portion F of the capacitive stack, which determines the capacitance of the overall structure, is located above the reduced-diameter position in the pores ("above" meaning further from the substrate than the position of reduced pore diameter). Thus, the performance of the capacitive stack is less affected by the surface condition of the anodization-resistant layer, e.g. cracks formed therein.

Various approaches may be used to form the functional portion of the capacitive stack above the reduced-diameter position in the pores. Below there is a description of certain techniques which control a relationship between the thickness of certain layers in the capacitive stack and the diameter of the pore at the position having reduced-diameter, so as to ensure that the functional portion of the capacitive stack is located above the reduced-diameter position in the pores. More particularly, according to these techniques the first conductive layer and first insulating layer of the capacitive stack have thicknesses, relative to the diameter of the reduced-diameter location in the pores, which mean that these layers clog the bottom of the pores and the second conductive layer does not pass through the "throat" of the reduced-diameter location. In other words:

$$D \leq 2(T_{c1} + T_{i1}) \quad (1)$$

where D is the diameter of the pore at the restricted-diameter location, $T_{c1}$ is the thickness of the first conductive layer, and $T_{i1}$ is the thickness of the first insulator layer.

A capacitive stack according to an embodiment of the invention will now be described with reference to FIG. 3, and an example embodiment of a method to fabricate this structure will be described with reference to FIG. 4.

Figure 3:
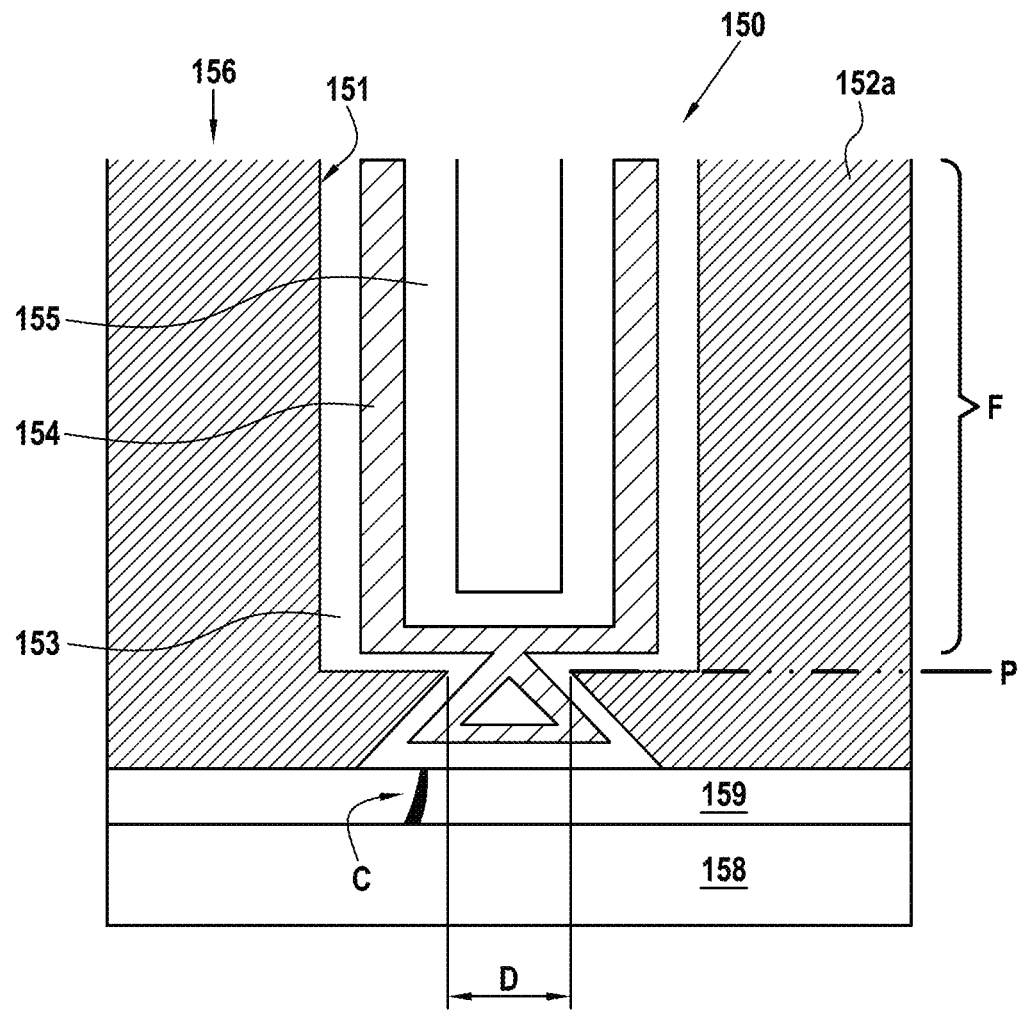
FIG. 3 illustrate, schematically, a capacitive structure according to an embodiment of the invention.

As can be seen from the partial, enlarged view shown in FIG. 3, a capacitive structure 150 according to the present embodiment includes a region 152a of porous anodic oxide formed on a stack of layers comprising: a lower electrically-conductive layer 158, and an upper layer 159 which is resistant to anodization/anodic etching. The stack of layers 158, 159 may be provided on a substrate (not shown), for example, in a case where the capacitive structure is being integrated with other electrical components, and/or in a case where a substrate can increase the strength of the overall structure. In cases where substrate is used and that substrate is electrically-conductive, the substrate may itself serve as an interconnection layer to electrically-connect the lowermost conductive layer at the bottom of one pore to those in neighboring pores. Accordingly, it may be possible in such cases to do without a separate layer 158. The pores 151 in the anodic oxide region 152a are open at the substrate side and have a position P where the diameter of the pore is reduced. The reduced-diameter position in the pore has a diameter designated D.

A first electrically-conductive layer 153 is formed conformally over the porous region 152a and comes into contact with the underlying stack of layers 158, 159. The anodization-resistant layer 159 has sufficient electrical conductivity to enable a good electrical connection to be made, at the bottoms of the pores, between the electrically-conductive layer 158 and the first conductive layer 153. In the embodiment illustrated in FIG. 3, the first conductive layer 153 is coated on the walls of the pore 151 and follows the generally-cylindrical shape along the majority of the pore's length, as well as following the shape of the pore wall at the bottom of the pore. Thus, the first conductive layer 153 passes through the reduced-diameter throat of the pore at position P and makes contact with the anodization-resistant layer 159. FIG. 3 illustrates a single pore 151 in a region of porous anodic oxide but it will be understood that, in practice, the first conductive layer 153 will conformally coat the walls of a group of adjacent pores in the region of porous anodic oxide.

As shown in FIG. 3, a first insulating layer 154 is provided on the first conductive layer 153 and generally follows the shape of the underlying first conductive layer 153. However, the thicknesses of the first conductive layer 153 and the first insulating layer 154 are such that the reduced-diameter throat of the pore is closed off. More particularly, the first insulating layer 154 coating opposing surfaces of the pore makes contact with itself at a location just above the reduced-diameter position P in the pore. So, the inner surface of the first insulating layer 154 defines a generally cylindrical bore whose diameter is substantially constant along its length. A second electrically-conductive layer 155 is provided on the inner surface of the first insulating layer 154. The second conductive layer 155 does not pass through the reduced-diameter throat of the pore; instead it conformally follows the shape of the inner surface of the first insulating layer 154 and, thus, it has a regular shape. In this example, the first conductive layer 153 constitutes the "lower conductive layer" recited in the claims and the second conductive layer 155 constitutes the "upper conductive layer" recited in the claims.

The second electrically conductive layer 155 forms a capacitive stack with the first conductive layer 153 and the intervening first insulating layer 154. A capacitive stack having layers of these kinds is often referred to as a MIM stack (from "metal-insulator-metal") even though the conductive layers may be formed of materials which are not pure metals.

The second conductive layer 155 is not present below the position P where the pore has reduced diameter. It is only the portion F of the stacked layers, where all three of the first conductive layer, first insulating layer and second conductive layer are present, that is operational as a capacitor. However, the lower section of the first conductive layer, which coats the pore walls at, and underneath, the position P having reduced pore-diameter, makes electrical contact between the functional portion F of the capacitive stack and the underlying interconnection layers 158, 159.

The capacitive stack may be formed of extra layers additional to the layers 153, 154, 155. Thus, for example, the capacitive stack may be a MIMIM stack, an MIMIMIM stack, and so on. In general, in cases where the capacitive stack includes extra layers, the "throat" at the reduced-diameter location in the pores becomes closed off between the first and second MIM structures. In cases where the lowermost conductive layer does not close off the "throat" at the reduced-diameter location, it is preferable that the throat should become closed off by the lowermost dielectric layer so that the second conductive layer in the stack (and the third conductive layer, etc., if present) does not reach the region below the throat where adverse effects may be caused by cracks in the anodization-resistant layer. However, if the conductive layers are very thin (e.g. approximately 5 nm or less) then it may be just the topmost conductive layer that fails to pass through the reduced-diameter location. In the latter example, the lowermost conductive layer of the MIMIM or MIMIMIM stack constitutes the "lower conductive layer" recited in the claims and the topmost conductive layer, that fails to pass through the reduced-diameter location in the pores, constitutes the "upper conductive layer" recited in the claims.

The first conductive layer may be made of TiN. Typically, the thickness of the first conductive layer 153 is in the range 1 nm-30 nm and may, for example, be approximately 10 nm. The material of the first conductive layer 153 is not limited to TiN and may, for example, be made of TiAlN, TaN, TaAlN, Ru, $RuO_2$, W, Ni, Co, Al, Ag, Au, Cu and Si.

The first insulating layer may be made of $SiO_2$. Typically, the thickness of the first insulating layer 154 is in the range 1 nm-30 nm and may, for example, be approximately 5 nm. The material of the first insulating layer 154 is not limited to $SiO_2$ and may, for example, be made of $Al_2O_3$, $HfO_2$, $ZrO_2$, $TiO_2$, $La_2O_3$, $Y_2O_3$, $SrTiO_3$ and their silicates and aluminates, and laminated structures.

The second conductive layer may be made of TiN. Typically, the thickness of the second conductive layer 155 is in the range 1 nm-30 nm and may, for example, be approximately 10 nm. The material of the second conductive layer 155 is not limited to TiN and may, for example, be made of TiAlN, TaN, TaAlN, Ru, $RuO_2$, W, Ni, Co, Al, Ag, Au, Cu and Si.

The anodization-resistant layer 159 may be made of W. Typically, the thickness of the anodization-resistant layer 159 is in the range 10 nm-1 um. The material of the anodization-resistant layer 159 is not limited to W and may, for example, be made of Ti, Ta, Hf and Nd.

The interconnection layer 158, if provided, may be made of AlCu. Typically, the thickness of the interconnection layer 158 is in the range 100 nm-5 μm, with thicknesses of 140 nm or above being preferred in view of ESR considerations. The material of the interconnection layer 158 is not limited to AlCu and may, for example, be made of Al, AlSi and AlSiCu.

The substrate (not shown) may be made of $p^{++}$ doped silicon. The material of the substrate is not limited to $p^{++}$ doped silicon and may, for example, be made of n-doped or non-doped Si, poly-Si and glass substrate.

Capacitive structures according to the invention may be stacked on top of one another, in comparable manner to the capacitive structures described in WO2015/063420. Accordingly, lateral isolation bands may be provided in the structure, as described in WO2015/063420.

Figure 4:
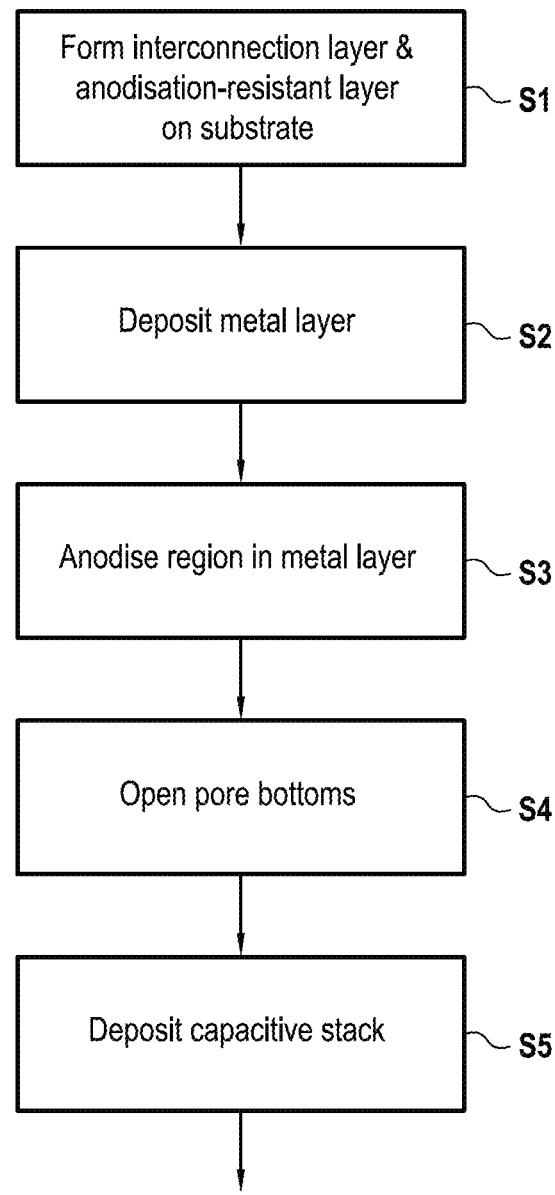
FIG. 4 is a flow diagram illustrating the main stages in a method, according to an embodiment of the present invention, for fabricating a capacitive structure such as that of FIG. 3.

FIG. 4 illustrates a method of fabricating a capacitive structure according to certain embodiments of the present invention, for example the structure illustrated in FIG. 3. The illustrated method includes a process (S1) of forming an electrically conductive interconnection layer, e.g. layer 158, on a substrate and forming an anodization-resistant layer, e.g. layer 159, on the interconnection layer. In this process S1 any suitable deposition techniques may be used, for example: chemical vapor deposition, physical vapor deposition, and so on. If desired, additional layers (not shown) may be provided between the substrate and the interconnection layer 158, and between the interconnection layer 158 and the anodization-resistant layer 159. Thus, for example, additional layers to improve adhesion may be interposed between the substrate and the interconnection layer 158, and between the interconnection layer 158 and the anodization-resistant layer 159. For instance, a laminated structure formed of a stack of thin Ti and TiN layers may be provided as an adhesion-improvement layer.

A metal layer is then formed (S2) on the anodization-resistant layer by any suitable method, for example: chemical vapor deposition, physical vapor deposition, and so on. The thickness of this metal layer is typically in the range 1 μm- 20 μm.

An anodization process (S3) is performed to anodize a region of the metal layer to form a region of porous anodic oxide, e.g. 152a, traversed by a plurality of elongated pores extending between the anodization-resistant layer and a surface 156 of the anodic oxide remote from the substrate. A mask may be used to define the region of the metal which is to be subjected to anodization.

In general, during the anodization process S3 some undesired oxide is formed at the bottoms of the pores. The undesired oxide is removed to open the pore bottoms (S4). The oxide may be removed by any suitable technique appropriate to the material used as the anodization-resistant layer; for example, by wet etching during which pH is controlled, and so on.

Next, the layers of the capacitive stack, e.g. layers 153, 154 and 155, are deposited conformally over the pores in the region of porous anodic oxide by any suitable method, for example: atomic layer deposition, chemical vapor deposition and so on. As noted above, the thicknesses of the layers may be set to ensure that relation (1) above is respected.

The operating conditions of the anodization process may be set and controlled, as is known, with a view to obtaining an array of elongated pores which, on average, have a target pore diameter and a target inter-pore spacing. Not all of the pores in the final structure have the target pore diameter and target inter-pore spacing, but the operating conditions can be set and controlled so that, statistically, a greater or lesser percentage of the pores respect the target values. In embodiments of the invention, the method of FIG. 4 is performed to produce a capacitive structure in which, in at least 1% of the pores of the porous anodic oxide region, the first portion of the capacitive stack of layers, which contributes to the capacitance of the capacitive structure, is formed in portions of the pores that are between a restricted-diameter position in the pore and the surface of the anodic oxide remote from the substrate.

Different techniques can be used to ensure that relationship (1) above is respected. Thus, for example, the anodization process (S3) may be controlled so that, towards the end, when material in the anodization-resistant layer begins to migrate and form undesired oxide plugs, the lateral size of the oxide plugs is controlled, thereby affecting the diameter of the restricted-diameter part of the pore.

Anodization processes suitable to produce a regular array of nanoscale pores in anodic oxide are known and so shall not be described in detail here. However, when applying such processes during the fabrication of capacitive structures according to embodiments of the invention, it can be advantageous to adapt the know processes.

Figure 5:
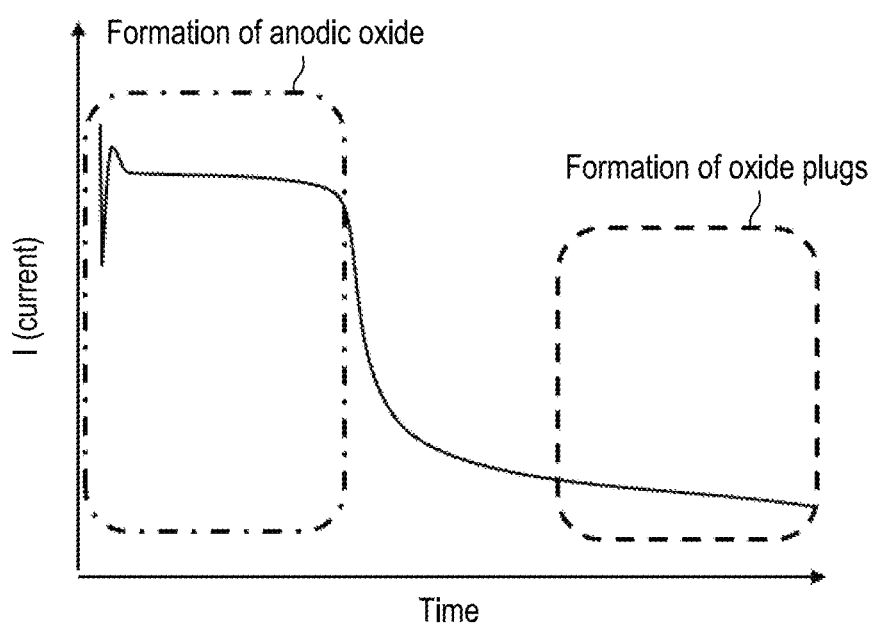
FIG. 5 illustrates how electric current varies during an anodization process.

So, for example, the onset of the stage where material in the anodization-resistant layer begins to migrate and form undesired oxide plugs can be detected, for example, by measuring the electric current being drawn during the anodization process. FIG. 5 illustrates a typical pattern of variation of current during the process of anodizing an aluminum layer to form anodic aluminum oxide (AAO). The point at which it is appropriate to stop anodization in order to achieve a particular width of the oxide plugs can be determined by measuring the time elapsed after a particular current value is attained.

In certain embodiments of the invention, the anodization conditions are deliberately changed part way through the anodization step, so as to slow down the rate of anodization during the time period when the anodization-resistant layer 158 is generating undesired oxide plugs. By slowing down the anodization process at this stage, it becomes easier to exercise fine control of the size, in the lateral direction (i.e. the left-to-right direction in FIG. 3), of the undesired oxide plugs. An example of a technique that can be used to slow down the anodization process at this stage is reduction of the operating temperature.

Another technique that may be used to help to ensure that relationship (1) above is respected is to determine the size of the diameter of the pores at the reduced-diameter location and then set the thicknesses of the first conductive layer and first insulating layer of the capacitive stack based on the diameter of the reduced-diameter location. In principle, the pore diameter at the restricted-diameter position could be measured in each individual capacitive structure, after its fabrication, but time can be saved by performing experiments ahead of time to determine what diameter value D is produced by particular sets of fabrication conditions (e.g. for a particular profile of the anodization process).

In general, it may be preferable to set the thicknesses of the conductive and insulating layers of the capacitive stack as a function of the desired capacitance value of the final structure. Thus, it may be preferable to first design the specification of the capacitive stack and then to control the anodization process so as to produce pores whose reduced-diameter position has a diameter D which ensures that relation (1) above is respected.

Although the present invention has been described above with reference to certain specific embodiments, it will be understood that the invention is not limited by the particularities of the specific embodiments. Numerous variations, modifications and developments may be made in the specified embodiments within the scope of the appended claims.

The invention claimed is:

1. A capacitive structure comprising:
a substrate providing an electrically-conductive interconnection layer;
an anodization-resistant layer formed over the electrically-conductive interconnection layer and making electrical contact with the interconnection layer;
a region of porous anodic oxide formed on the anodization-resistant layer, the region of porous anodic oxide being traversed by a plurality of elongated pores extending between the anodization-resistant layer and a surface of the anodic oxide remote from the substrate; and a capacitive stack of layers comprising a lower conductive layer, a first insulator layer, and an upper conductive layer, said stack being formed conformally over the pores in said region of porous anodic oxide, and the lower conductive layer being in electrical contact with the anodization-resistant layer, wherein the pores have a position, along their length, where the pore diameter is restricted, and wherein, in a first, non-zero percentage of the pores of said region of porous anodic oxide, the upper conductive layer of said stack extends into the pores no further than said position where the pore diameter is restricted.

2. The capacitive structure according to claim 1, wherein the lower conductive layer of the stack is formed conformally over the pores in the porous region, the first insulator layer is formed on the lower conductive layer, and the upper conductive layer is formed on the first insulator layer.

3. The capacitive structure according to claim 2, wherein:

$$D \leq 2(T_{c1}+T_{i1}),$$

where D is the diameter of the pore at the position where the pore diameter is restricted, $T_{c1}$ is the thickness of the lower conductive layer, and $T_{i1}$ is the thickness of the first insulator layer.

4. The capacitive structure according to any claim 1, wherein said position where the pore diameter is restricted and is located at a distance of 10-300 nm from the bottom of the pores.

5. The capacitive structure according to claim 1, wherein in at least 1% of the pores of the porous anodic oxide region the upper conductive layer of said stack extends into the pores no further than said position where the pore diameter is restricted.

6. The capacitive structure according to claim 1, wherein the anodization-resistant layer is made of tungsten.

7. The capacitive structure according to claim 1, wherein the average thickness of the anodization-resistant layer is in the range 10 nm-1 μm.

8. The capacitive structure according to claim 1, wherein the anodic oxide is anodic aluminum oxide.

9. A method of fabricating a capacitive structure comprising:

forming a substrate providing an electrically-conductive interconnection layer;

forming over the electrically-conductive interconnection layer an anodization-resistant layer making electrical contact with the interconnection layer;

forming a metal layer on the anodization-resistant layer;

anodizing a region of the metal layer to form a region of porous anodic oxide traversed by a plurality of elongated pores extending between the anodization-resistant layer and a surface of the anodic oxide remote from the substrate;

removing oxide formed, at the bottoms of the pores, from the anodization-resistant layer during the anodizing step; and forming conformally over the pores in said region of porous anodic oxide a capacitive stack of layers comprising a lower conductive layer, a first insulator layer, and an upper conductive layer, wherein the lower conductive layer is in electrical contact with the anodization-resistant layer, wherein the pores have a position, along their length, where the pore diameter is restricted, and wherein at least one of the anodizing, removing of the oxide, and forming of the capacitive structure is controlled so that, in at least 1% of the pores of the porous anodic oxide region, the upper conductive layer of said stack extends into the pores no further than said position where the pore diameter is restricted.

10. The capacitive-structure fabrication method according to claim 9, wherein the lower conductive layer of the stack is formed conformally over the pores in the porous region, the first insulator layer is formed on the lower conductive layer, and the upper conductive layer is formed on the first insulator layer.

11. The capacitive-structure fabrication method according to claim 10, wherein:

$$D \leq 2(T_{c1}+T_{i1}),$$

where D is the diameter of the pore at the restricted-diameter location, $T_{c1}$ is the thickness of the lower conductive layer, and $T_{i1}$ is the thickness of the first insulator layer.

12. The capacitive-structure fabrication method according to claim 9, wherein said position where the diameter of the pores is restricted is located at a distance of 10-300 nm from the bottom of the pores.

13. The capacitive-structure fabrication method according to claim 9, wherein the anodization-resistant layer is made of tungsten.

14. The capacitive-structure fabrication method according to claim 9, wherein the average thickness of the anodization-resistant layer is in the range 10 nm-1 μm.

15. The capacitive-structure fabrication method according to claim 9, wherein the anodic oxide is anodic aluminum oxide.

* * * * *